United States Patent
Liu et al.

(10) Patent No.: US 7,911,056 B2
(45) Date of Patent: Mar. 22, 2011

(54) SUBSTRATE STRUCTURE HAVING N-SMD BALL PADS

(75) Inventors: Pai-Chou Liu, Kaohsiung (TW); Yu-Hsin Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 215 days.

(21) Appl. No.: 11/651,540

(22) Filed: Jan. 10, 2007

(65) Prior Publication Data

US 2008/0042278 A1  Feb. 21, 2008

(30) Foreign Application Priority Data

Aug. 15, 2006 (TW) ............................ 95129920 A

(51) Int. Cl. *H01L 23/48* (2006.01)
(52) U.S. Cl. .......................... 257/738; 257/779
(58) Field of Classification Search .............. 257/738, 257/779, 780
See application file for complete search history.

(56) References Cited

U.S. PATENT DOCUMENTS

| 5,482,736 A * | 1/1996 | Glenn et al. ................ 427/97.2 |
| 5,872,399 A * | 2/1999 | Lee ............................. 257/738 |
| 6,201,305 B1 * | 3/2001 | Darveaux et al. ............. 257/779 |
| 2002/0111054 A1 * | 8/2002 | Huang et al. .................... 439/83 |
| 2006/0049516 A1 * | 3/2006 | Wang et al. .................... 257/734 |
| 2006/0216860 A1 * | 9/2006 | Pendse ........................... 438/108 |

FOREIGN PATENT DOCUMENTS

| JP | 07038231 | * | 2/1995 |
| JP | 08-230346 | * | 9/1996 |

* cited by examiner

*Primary Examiner* — Andy Huynh
*Assistant Examiner* — Kimberly M Thomas
(74) *Attorney, Agent, or Firm* — Volentine & Whitt, P.L.L.C.

(57) ABSTRACT

A substrate structure having non-solder mask design (N-SMD) ball pads. The substrate structure includes a substrate and a solder mask. The substrate has a first surface, a trace layer and at least one ball pad. The ball pad and the trace layer are disposed on the first surface. The trace layer has a plurality of traces, and at least one trace electrically connects to the ball pad. The solder mask has at least one opening corresponding to the ball pad. The size of the opening is larger than that of the ball pad. The solder mask covers the trace connecting to the ball pad. The problem of non-alignment of the solder ball can thus be solved, and the hole in the solder ball can be prevented when the substrate structure is welded with a PCB so that the reliability of solder ball welding can be improved.

6 Claims, 5 Drawing Sheets

SUBSTRATE STRUCTURE HAVING N-SMD BALL PADS

BACKGROUND OF THE INVENTION

1. Field of the Invention

The invention relates to a substrate structure having ball pads, particularly to a substrate structure having non-solder mask design ball pads.

2. Description of the Related Art

The conventional substrate used for BGA IC package has two types: one is solder mask design (SMD) substrate, and the other is non-solder mask design (N-SMD) substrate. For the SMD substrate, there is no gap between the solder pads and the solder mask of the substrate, so that holes will exist in the solder ball because the solder material on a printed circuit board comprising volatile flux when the BGA IC package substrate is welded with the printed circuit board. Therefore, the reliability of solder ball welding may decrease.

FIG. 1 and FIG. 2 show a conventional substrate structure 1 having N-SMD ball pads for BGA IC package. The substrate structure 1 comprises a substrate 10, a trace layer 11 and a solder mask 12. The substrate 10 has a first surface 101, and at least one ball pad 102 is disposed on the first surface 101. The trace layer 11 is disposed on the first surface 101 and is electrically connected to the ball pad 102. The solder mask 12 is used to cover part of the trace layer 11. The solder mask 12 has an opening 121 formed on the corresponding position of the ball pad 102. The shapes of the opening 121 and the ball pad 102 are round, and the size of the opening 121 is larger than that of the ball pad 102. And, part of the trace 11 is exposed between the opening 121 and the ball pad 102.

Referring to FIG. 3, in order to improve the problem of holes in the solder ball of the SMD substrate, the size of the opening 121 of the substrate structure 1 having N-SMD ball pads is larger than that of the ball pad 102, so that the air in the solder ball 14 can be exhausted through the space between the opening 121 and the ball pad 102 when the substrate structure 1 is welded with a printed circuit board 13. Therefore, the problem of holes in the solder ball 14 can be avoided, and the reliability of solder ball welding can be improved. However, the solder mask 12 only covers part of the trace 11, so that the solder ball 15 will be dragged by the exposed part of the trace 11, and non-alignment and displacement of the solder ball 15 therefore occur when proceeding with a subsequent reflowing step for mounting solder ball 15 on the ball pad 102, as shown in FIG. 4.

Consequently, there is an existing need for providing a substrate structure having non-solder mask design ball pads to solve the above-mentioned problems.

SUMMARY OF THE INVENTION

One objective of the present invention is to provide a substrate structure having non-solder mask design (N-SMD) ball pads. The substrate structure comprises a substrate and a solder mask. The substrate has a first surface, a trace layer and at least one ball pad. The ball pad and the trace layer are disposed on the first surface. The trace layer has a plurality of traces, and at least one trace electrically connects to the ball pad. The solder mask has at least one opening corresponding the ball pad. The size of the opening is larger than that of the ball pad. The solder mask covers the trace connecting to the ball pad. By utilizing the substrate structure of the invention, the problem of non-alignment of the solder ball can be solved, and the hole in the solder ball can be prevented when the substrate structure is welded with a PCB so that the reliability of solder ball welding can be improved.

DETAILED DESCRIPTION OF THE INVENTION

Figure 1:
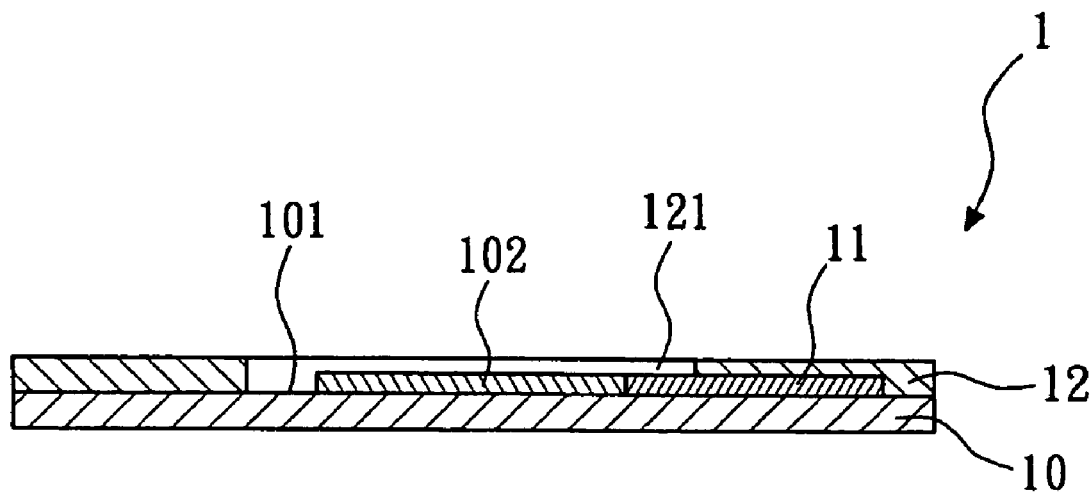
FIG. 1 shows the sectional view of a conventional substrate structure having N-SMD ball pads.
Figure 2:
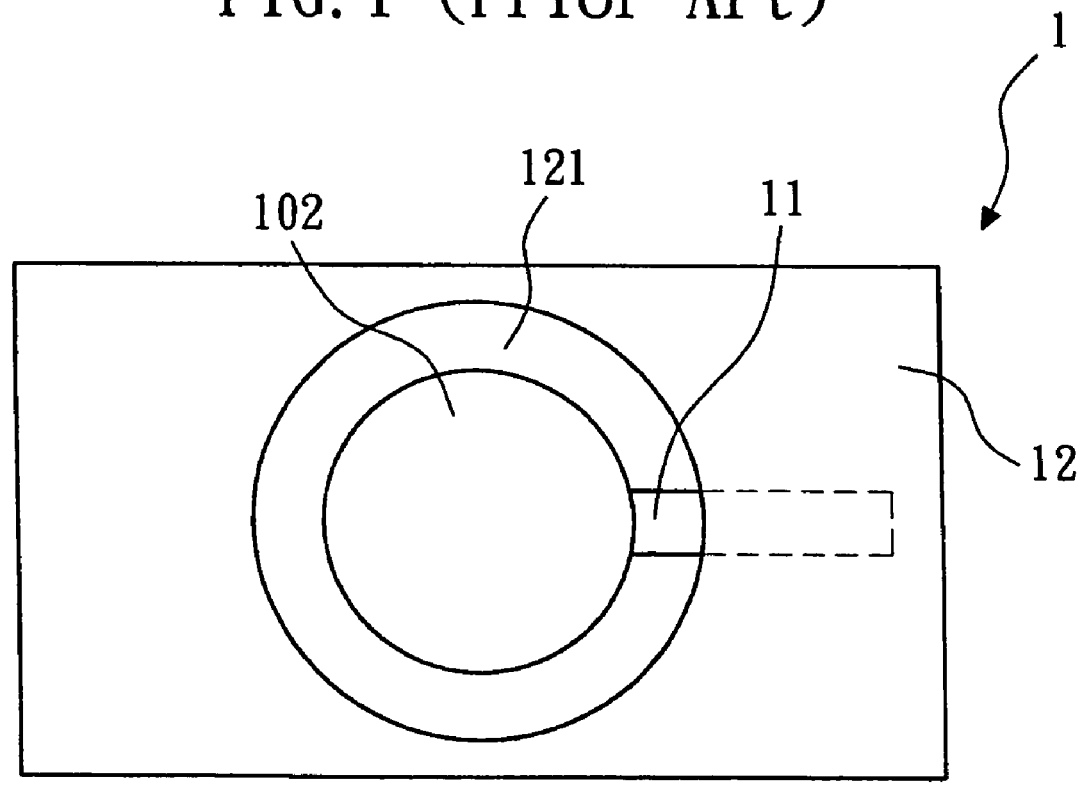
FIG. 2 shows the top view of a conventional substrate structure having N-SMD ball pads.
Figure 3:
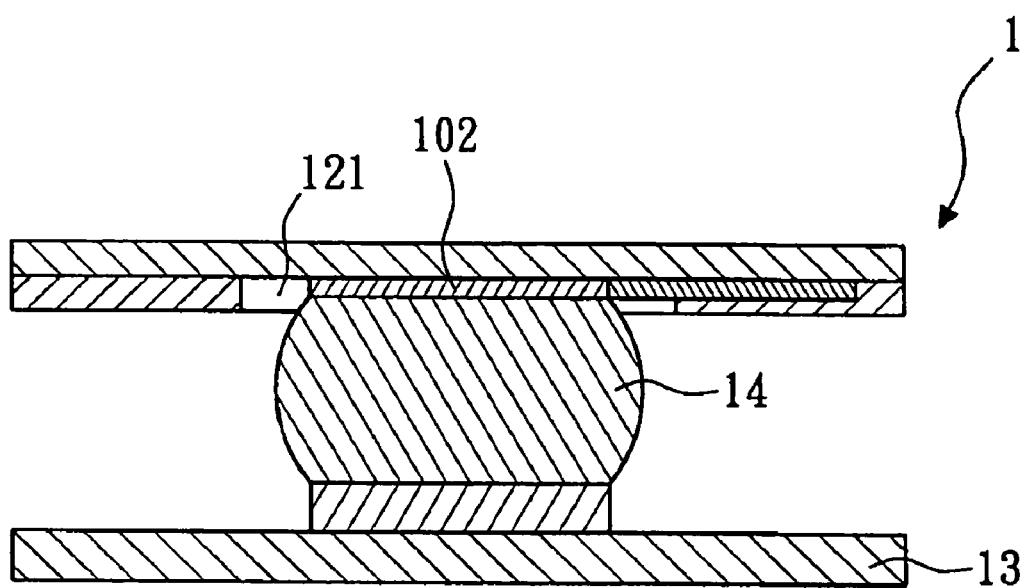
FIG. 3 shows a conventional SMD substrate assembled to a PCB.
Figure 4:
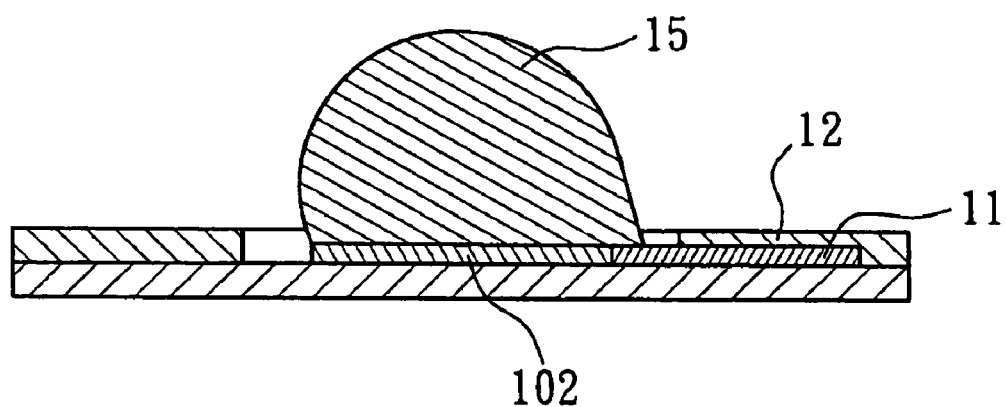
FIG. 4 shows solder balls mounted on a conventional SMD substrate.
Figure 5:
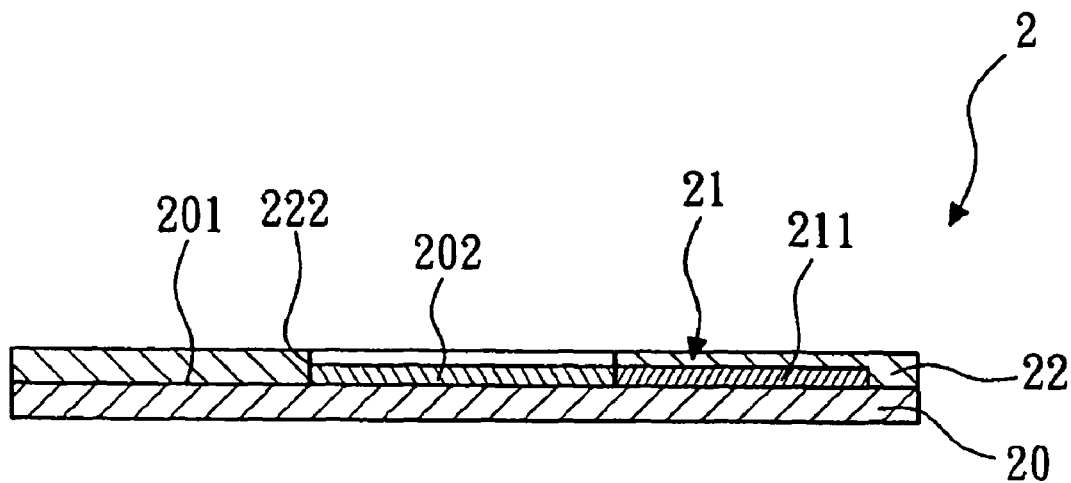
FIG. 5 shows the sectional view of a substrate structure having N-SMD ball pads according to a first embodiment of the present invention.
Figure 6:
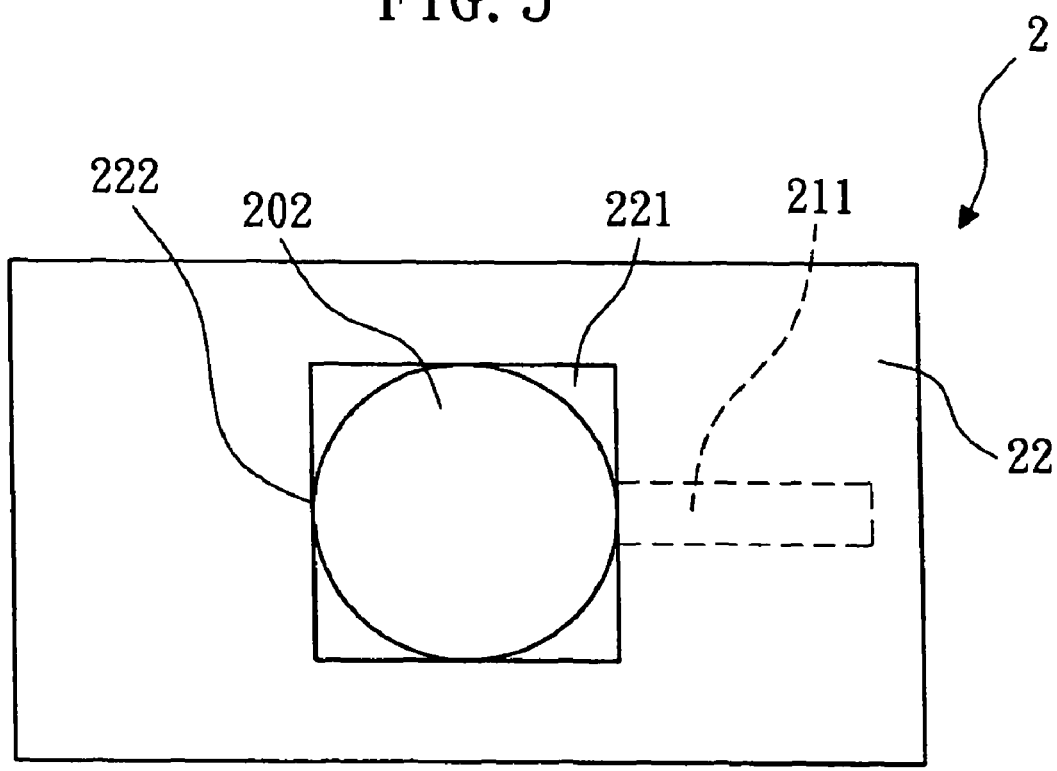
FIG. 6 shows the top view of a substrate structure having N-SMD ball pads according to a first embodiment of the present invention.

FIG. 5 and FIG. 6 show a substrate structure having non-solder mask design (N-SMD) ball pads according to a first embodiment of the present invention. The substrate structure 2 comprises a substrate 20 and a solder mask 22. The substrate 20 has a first surface 201, a trace layer 21 and at least one ball pad 202. The ball pad 202 is disposed on the first surface 201. In the embodiment, the ball pad 202 is made of copper, and the ball pad 202 is circle-shaped. It is should be noted that the ball pad 202 is not limited to being circle-shaped, the ball pad 202 may be in any shape.

The trace layer 21 is disposed on the first surface 201 and is electrically connected to the ball pad 202. The trace layer 21 has a plurality of traces 211 and may be electrically connected to the ball pad 202 by at least one trace 211. However, in the embodiment, the trace layer 21 is electrically connected to the ball pad 202 by only one trace 211 for explanation.

The solder mask 22 is used to totally cover the trace layer 21. The solder mask 22 has at least one opening 221, and the opening 221 corresponds to the ball pad 202. The size of the opening 221 is larger than that of the ball pad 202. The opening 221 may be a polygon and has a plurality of sides 222. At least one of the sides 222 of the opening 221 is tangent to the edge of the ball pad 202, so that the trace 211 does not be exposed in the opening 221. In the embodiment, the opening 221 is a square, and four sides of the opening 221 are tangent to the round ball pad 202. In addition, according to different applications, the substrate structure 2 may be a BGA IC package substrate or a printed circuit board.

According to the first embodiment since the solder mask 22 of the substrate structure 2 of totally covers the trace 211, the solder ball will not be dragged by the trace 211, and non-alignment and displacement of the solder ball can be avoided when proceeding with a subsequent reflowing step for mounting the solder ball on the ball pad 202. Furthermore, the opening 221 is larger than that of the ball pad 202, so that the air in the solder ball can be exhausted through the space between the opening 221 and the ball pad 202 when the solder ball-mounted substrate structure 2 is welded with a printed circuit board (not shown). Therefore, holes in the solder ball can be prevented when the substrate structure 2 is welded with the printed circuit board so that the reliability of solder ball welding can be improved.

Figure 7:
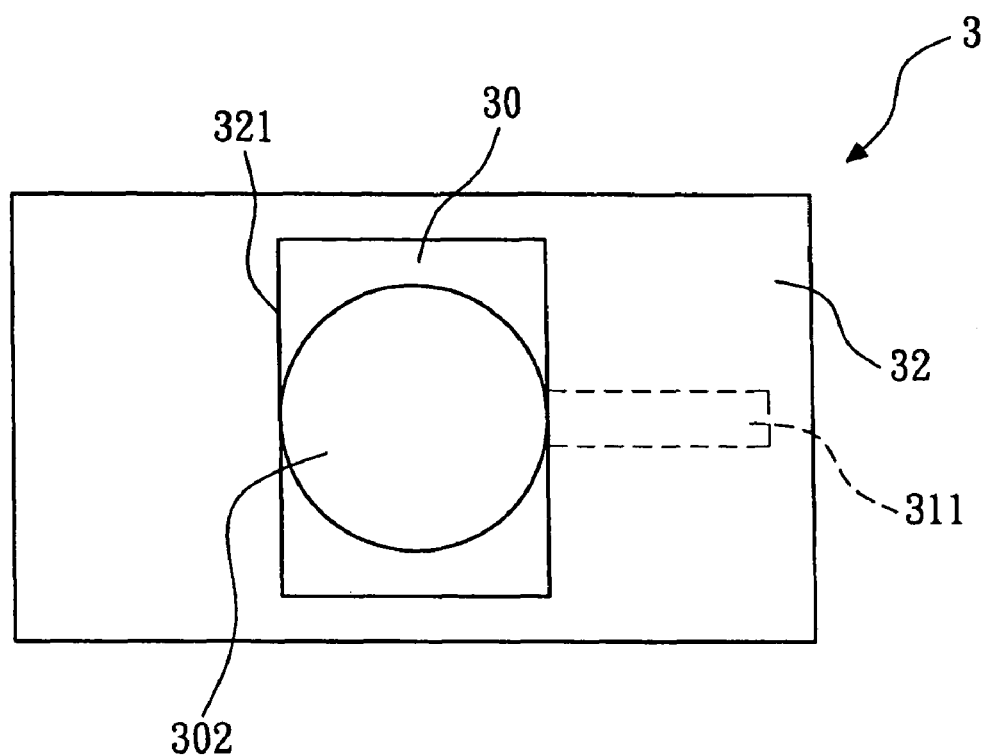
FIG. 7 shows the top view of a substrate structure having N-SMD ball pads according to a second embodiment of the present invention.

FIG. 7 shows a substrate structure having N-SMD ball pads according to a second embodiment of the present invention. The substrate structure 3 of the second embodiment comprises a substrate 30 and a solder mask 32. The difference between the substrate structure 3 of the second embodiment and the substrate structure 2 of the first embodiment is that in the second embodiment the opening 321 is a rectangle. In the first embodiment, all four sides 222 of the opening 221 are tangent to the round ball pad 202, in the second embodiment, only two corresponding longer sides 322 of the opening 321 are tangent to the round ball pad 302. The solder mask 32 also covers the trace 311, and the rectangle opening 321 can provide more space for air exhausting.

Figure 8:
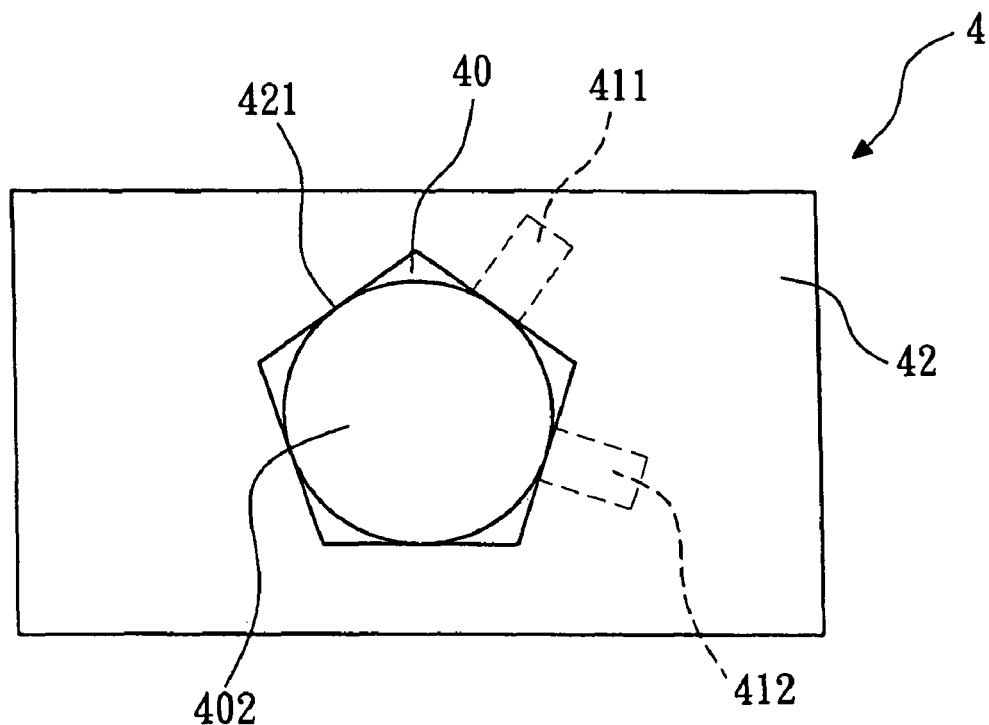
FIG. 8 shows the top view of a substrate structure having N-SMD ball pads according to a third embodiment of the present invention.

FIG. 8 shows a substrate structure having N-SMD ball pads according to a third embodiment of the present invention. The substrate structure 4 of the third embodiment comprises a substrate 40 and a solder mask 42. The difference between the substrate structure 4 of the third embodiment and the substrate structure 2 of the first embodiment is that in the third embodiment the opening 421 is a pentagon. In the third embodiment, all the five sides 422 of the opening 421 are tangent to the round ball pad 402. The opening 421 corresponds to the position of the traces 411, 412 so that the solder mask 42 can cover the traces 411, 412.

Figure 9:
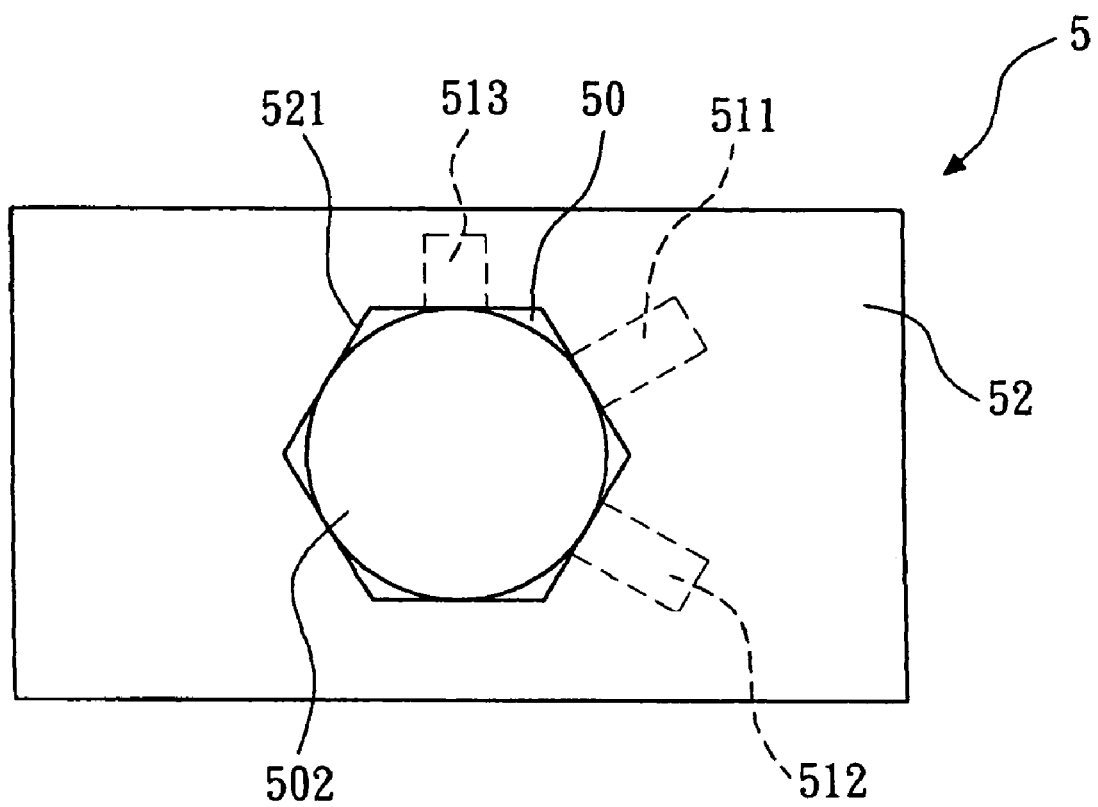
FIG. 9 shows the top view of a substrate structure having N-SMD ball pads according to a fourth embodiment of the present invention.

FIG. 9 shows a substrate structure having N-SMD ball pads according to a fourth embodiment of the present invention. The substrate structure 5 of the fourth embodiment comprises a substrate 50 and a solder mask 52. The difference between the substrate structure 5 of the fourth embodiment and the substrate structure 2 of the first embodiment is that in the fourth embodiment the opening 521 is a hexagon. In the fourth embodiment, all the six sides 522 of the opening 521 are tangent to the round ball pad 502, and there are three traces 511, 512, 513 connected to the ball pad 502. In order to match up the positions of the traces 511, 512, 513, the opening 521 is therefore designed as a hexagon so that the solder mask 52 can cover the traces 511, 512, 513.

In above-mentioned substrate structure having N-SMD ball pad from the first embodiment to the fourth embodiment, the shape of the opening may be designed according to the space for exhausting air or the positions of the traces so as to satisfy the requirements of various applications.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A substrate structure having N-SMD ball pads, comprising:
    a substrate, having a first surface, a trace layer and at least one ball pad, the ball pad and the trace layer disposed on the first surface, the trace layer having a plurality of traces, at least one trace electrically connecting to the ball pad, and the trace and the ball pad are disposed on a same plane; and
    a solder mask, having at least one opening corresponding to the ball pad, a size of the opening being larger than that of the ball pad, and the solder mask covering the trace connecting to the ball pad,
    wherein the opening is a polygon which has a plurality of sides, at least one of the sides of the opening is tangent to an edge of the ball pad, the trace is not exposed in the opening, and the solder mask does not expose any part of the trace connecting to the ball pad.

2. The substrate structure according to claim 1, wherein the opening is a rectangle.

3. The substrate structure according to claim 1, wherein the opening is a square.

4. The substrate structure according to claim 3, wherein the sides of the square are tangent to edges of the ball pad.

5. The substrate structure according to claim 1, wherein substrate structure is a BGA IC package substrate.

6. The substrate structure according to claim 1, wherein the substrate structure is a printed circuit board.

* * * * *